(12) United States Patent
Lim et al.

(10) Patent No.: US 7,884,909 B2
(45) Date of Patent: Feb. 8, 2011

(54) TRANSFLECTIVE LIQUID CRYSTAL DISPLAY DEVICE AND FABRICATING METHOD THEREOF

(75) Inventors: Byoung-Ho Lim, Gyeongsangbuk-do (KR); Sun-Hwa Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 966 days.

(21) Appl. No.: 11/016,859

(22) Filed: Dec. 21, 2004

(65) Prior Publication Data

US 2005/0140874 A1    Jun. 30, 2005

(30) Foreign Application Priority Data

Dec. 30, 2003    (KR) .................. 10-2003-0100667

(51) Int. Cl.
*G02F 1/1343* (2006.01)
(52) U.S. Cl. .................................................. 349/141
(58) Field of Classification Search ................ 349/113, 349/114; 257/72
See application file for complete search history.

(56) References Cited

U.S. PATENT DOCUMENTS

| | | | | |
|---|---|---|---|---|
| 5,539,551 | A * | 7/1996 | Nomoto et al. ............... 349/42 |
| 6,466,280 | B1 * | 10/2002 | Park et al. ..................... 349/43 |
| 6,545,293 | B2 * | 4/2003 | Wong .......................... 257/59 |
| 6,620,655 | B2 | 9/2003 | Ha et al. |
| 6,642,580 | B1 | 11/2003 | Yun |
| 6,654,076 | B2 * | 11/2003 | Ha et al. ....................... 349/43 |
| 7,006,179 | B2 * | 2/2006 | Kim ............................ 349/113 |
| 7,064,347 | B2 * | 6/2006 | Chang et al. .................. 257/59 |
| 7,166,498 | B2 * | 1/2007 | Yoo et al. ..................... 438/149 |
| 2001/0020991 | A1 * | 9/2001 | Kubo et al. .................. 349/113 |
| 2002/0084459 | A1 * | 7/2002 | Choi et al. .................... 257/72 |
| 2002/0093599 | A1 * | 7/2002 | Ha et al. ....................... 349/38 |
| 2002/0105604 | A1 | 8/2002 | Ha et al. |
| 2002/0113927 | A1 | 8/2002 | Ha et al. |
| 2003/0007114 | A1 | 1/2003 | Kim et al. |
| 2003/0086036 | A1 * | 5/2003 | Yang et al. .................. 349/113 |
| 2003/0107688 | A1 * | 6/2003 | Yamagishi .................... 349/62 |

(Continued)

FOREIGN PATENT DOCUMENTS

JP        06102528  A  *  4/1994

(Continued)

*Primary Examiner*—David Nelms
*Assistant Examiner*—Lauren Nguyen
(74) *Attorney, Agent, or Firm*—Morgan, Lewis & Bockius LLP

(57) ABSTRACT

A substrate for a transflective liquid crystal display device includes a plurality of gate lines on a substrate; at least one data line crossing the plurality of gate lines to define a pixel region including a transmissive portion and a reflective portion; a thin film transistor connected to one of the plurality of gate lines and the at least one data line, the thin film transistor including a gate electrode, a semiconductor layer, a source electrode and a drain electrode; a first insulating layer covering a portion of the thin film transistor, the first insulating layer uncovering the pixel region and a portion of the drain electrode; a transparent electrode in the pixel region, the transparent electrode directly contacting the drain electrode and the semiconductor layer; and a reflective layer in the reflective portion, the reflective layer having a first uneven surface.

7 Claims, 9 Drawing Sheets

U.S. PATENT DOCUMENTS

| | | |
|---|---|---|
| 2003/0128329 A1 | 7/2003 | Kim |
| 2003/0133059 A1* | 7/2003 | Wei et al. .................... 349/113 |
| 2005/0094079 A1* | 5/2005 | Yoo et al. .................... 349/141 |
| 2005/0133787 A1* | 6/2005 | Park ............................ 257/57 |

FOREIGN PATENT DOCUMENTS

| | | |
|---|---|---|
| JP | 2003-121836 | 4/2003 |
| KR | 2001-0065037 | 7/2001 |
| KR | 2002-0082789 | 10/2002 |

* cited by examiner

US 7,884,909 B2

TRANSFLECTIVE LIQUID CRYSTAL DISPLAY DEVICE AND FABRICATING METHOD THEREOF

The present invention claims the benefit of Korean Patent Application No. 2003-100667, filed in Korea on Dec. 30, 2003, which is hereby incorporated by reference.

BACKGROUND OF THE INVENTION

1. Field of the Invention

The present invention relates to a liquid crystal display device, and more particularly, to a transflective liquid crystal display device and a fabricating method thereof.

2. Discussion of the Related Art

Generally, a transflective liquid crystal display (LCD) device functions both as a transmissive LCD device and a reflective LCD device. Transflective LCD devices are more versatile because they can use both a backlight and ambient light as light sources. Moreover, transflective LCD devices have low power consumption.

FIG. 1 is an exploded perspective view of an LCD device according to the related art. Referring to FIG. 1, a liquid crystal display (LCD) device 10 has an upper substrate 12 having a black matrix 17. A color filter layer 16 of the LCD device 10 includes sub-color filters. The LCD device 10 includes a common electrode 13 on the color filter layer 16, and a lower substrate 14 having a switching element, a thin film transistor (TFT) T, and a transparent electrode 20a connected to the TFT T. A liquid crystal material 18 is interposed between the upper and lower substrates 12 and 14. The lower substrate 14 is referred to as an array substrate because an array of lines, including gate lines 25 and data lines 27, is formed thereon. The gate lines 25 and the data lines 27 cross each other to form a matrix. The TFT T is connected to one of the gate lines 25 and one of the data lines 27. A pixel region P is defined between the gate lines 25 and the data lines 27. The TFT T is formed near a crossing of the gate lines 25 and the data lines 27. The transparent electrode 20a is formed of a transparent conductive material, such as indium-tin-oxide (ITO) and indium-zinc-oxide (IZO), in the pixel region P. The upper substrate 12 is referred to as a color filter substrate because the color filter layer 16 is formed thereon.

A reflective electrode 20b consisting of a reflective material, such as aluminum (Al) or Al alloy, is formed in the pixel region P. The reflective electrode 20b has a transmissive hole H so that the pixel region P is divided into a reflective portion D and a transmissive portion B. The transmissive portion B corresponds to the transmissive hole H and the reflective portion D corresponds to the reflective electrode 20b.

The transflective LCD device is manufactured to selectively use a reflective mode, which depends on natural light, or a transmissive mode, which depends on a light source. The utilization efficiency of light is lower in the reflective mode than in the transmissive mode. Thus, brightness variation occurs in a transition from the reflective mode to the transmissive mode. To solve the problem, an uneven reflective layer is formed on the reflective portion in the related art LCD device to induce an irregular reflection by minimizing a specular-reflection of the incident ambient light and to improve brightness uniformity in the reflected mode and the transmissive mode.

FIG. 2 is a plan view of a pixel region of a transflective LCD device having an uneven reflective layer according to the related art. Referring to FIG. 2, a gate line 34 is formed on a substrate 30 along a first direction. A data line 46 crosses the gate line 34 to define a pixel region P. A thin film transistor T is formed near a crossing of the gate line 34 and the data line 46. The thin film transistor T includes a gate electrode 32, a semiconductor layer 41, a source electrode 42 and a drain electrode 44.

A transparent electrode 50 is formed in the pixel region P. The transparent electrode 50 is connected to the thin film transistor T. A reflective electrode 56 is also formed in the pixel region P. The reflective electrode 56 has a transmissive hole H that exposes the central portion of the transparent electrode 50.

A reflective portion D of the pixel region P corresponds to the transmissive hole H. A transmissive portion B of the pixel region P corresponds to the transparent electrode 50 excluding the reflective portion D. Specifically, the transparent electrode 50, which is located in the transmissive portion B and is connected to the drain electrode 44, generates a vertical field with respect to the common electrode 13 (shown in FIG. 1) through the liquid crystal layer 18 (shown in FIG. 1). The reflective electrode 56 reflects incident light.

The reflective layer is formed with an uneven surface to improve reflection efficiency. Thus, the brightness of the LCD device is improved and the viewing angle is widened. However, fabrication of the transflective LCD device increases the manufacturing complexity because of the additional mask process for forming the uneven reflective layer.

FIG. 3A is a cross-sectional view taken along line III-III of FIG. 2, showing a first mask process for fabricating a transflective LCD device according to the related art. Referring to FIG. 3A, a pixel region P is defined as a unit region for displaying an image. A switching device (shown in FIG. 2) is positioned in a switching region S on the substrate 30. The pixel region P includes a transmissive portion B and a reflective portion D. A gate line 34 (shown in FIG. 2) and a gate electrode 32 are formed using a metallic material having a low resistance on the substrate 30 through a first mask process. The gate electrode 32 is connected to the gate line 34.

Although not shown, the first mask process, which is a photolithography process, includes coating a photoresist on the metallic material layer, exposing the photoresist using a photo mask and developing the photoresist to form a photoresist pattern (not shown). The photoresist pattern is formed to shield the metallic material in a subsequent process. The first mask process further includes etching the metallic material using the photoresist pattern as a shield to pattern the gate line 34 (shown in FIG. 2) and the gate electrode 32. The steps of the first mask process can also be used in subsequent mask processes.

FIG. 3B is a cross-sectional view taken along line III-III of FIG. 2, showing a second mask process for fabricating a transflective LCD device according to the related art. Referring to FIG. 3B, a gate insulating layer 36 is formed using an inorganic insulating material over the entire surface of the substrate 30 including the gate line 34 (shown in FIG. 2) and the gate electrode 32 through a second mask process. An active layer 38 and an ohmic contact layer 40 are formed by patterning intrinsic amorphous silicon and impurity-doped amorphous silicon on the gate insulating layer 36 through the second mask process. In other words, the active layer 38 and the ohmic contact layer 40 are made of the intrinsic amorphous silicon and the impurity-doped amorphous silicon, respectively. The active layer 38 and the ohmic contact layer 40 constitute a semiconductor layer 41.

FIG. 3C is a cross-sectional view taken along line III-III of FIG. 2, showing third and fourth mask processes for fabricating a transflective LCD device according to the related art. Referring to FIG. 3C, a source electrode 42 and a drain electrode 44 are formed on the semiconductor layer 41 by a third mask process using a metallic material similar to that mentioned in FIG. 3A. A passivation layer 48 having a drain contact hole 49 that exposes the portion of the drain electrode 44 is formed by a fourth mask process using an organic or an inorganic insulating material over the entire surface of the substrate 30 having the source and drain electrodes 42 and 44.

FIG. 3D is a cross-sectional view taken along line III-III of FIG. 2, showing a fifth mask process for fabricating a transflective LCD device according to the related art. Referring to FIG. 3D, a transparent electrode 50 is formed through a fifth mask process using a transparent conductive material on the passivation layer 48. The transparent electrode 50 is connected to the drain electrode 44 via the drain contact hole 49.

FIG. 3E is a cross-sectional view taken along line III-III of FIG. 2, showing a sixth mask process for fabricating a transflective LCD device according to the related art. Referring to FIG. 3E, an organic insulating layer 51 is formed through a sixth mask process using an organic insulating material over the entire surface of the substrate 30 including the transparent electrode 50. The organic insulating material has good step-coverage property.

In the same mask process, a contact hole C1, a transmissive hole C2, and an uneven portion 52 are formed. The contact hole C1 exposes a portion of the transparent electrode 50. The transmissive hole C2 exposes a main portion of the transparent electrode 50 in the pixel region P. The uneven portion 52 is formed on the surface of the organic insulating layer 51 in the reflective portion D including the switching region S. The uneven portion 52 may be formed by melting the patterned organic insulating layer 51 that initially had a saw-tooth cross-section.

FIG. 3F is a cross-sectional view taken along line III-III of FIG. 2, showing a seven mask process for fabricating a transflective LCD device according to the related art. Referring to FIG. 3F, a reflective electrode 56 is formed through a seven mask process using a metallic material having good reflectivity. The reflective electrode 56 is formed over the substrate 30 including the unevenness 52. The reflective electrode 56 is located in the reflective portion D and is connected to the transparent electrode 50.

The related art fabricating method of the transflective LCD device has several problems. The mask processes are very complicated. Moreover, the production yield is reduced by the additional process for forming the uneven reflective pattern.

SUMMARY OF THE INVENTION

Accordingly, the present invention is directed to a transflective LCD device and a fabricating method thereof that substantially obviate one or more of the problems due to limitations and disadvantages of the related art.

An object of the present invention is to provide a transflective LCD device having high-reflectivity.

Another object of the present invention is to provide a method of fabricating a transflective LCD device having high-reflectivity.

Another object of the present invention is to provide a reduced number of mask processes for fabricating a transflective LCD device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a substrate for a transflective liquid crystal display device includes a plurality of gate lines on a substrate; at least one data line crossing the plurality of gate lines to define a pixel region including a transmissive portion and a reflective portion; a thin film transistor connected to one of the plurality of gate lines and the at least one data line, the thin film transistor including a gate electrode, a semiconductor layer, a source electrode and a drain electrode; a first insulating layer covering a portion of the thin film transistor, the first insulating layer uncovering the pixel region and a portion of the drain electrode; a transparent electrode in the pixel region, the transparent electrode directly contacting the drain electrode and the semiconductor layer; and a reflective layer in the reflective portion, the reflective layer having a first uneven surface.

In another aspect, a method of fabricating a substrate for a transflective liquid crystal display device includes forming a plurality of gate lines on a substrate; forming at least one data line, a thin film transistor including a source electrode and a drain electrode, the at least one data line crossing the plurality of gate lines to define a pixel region including a transmissive portion and a reflective portion, the source electrode being connected to the at least one data line, and the drain electrode being spaced apart from the source electrode; forming a first insulating layer covering a portion of the thin film transistor, the first insulating layer uncovering the pixel region and a portion of the drain electrode; forming a transparent electrode in the pixel region, the transparent electrode directly contacting the drain electrode and the semiconductor layer; forming a second insulating layer on the transparent electrode, the second insulating layer having a first uneven surface; and forming a reflective layer in the reflective portion, the reflective layer having a second uneven surface corresponding to the first uneven surface.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention.

DETAILED DESCRIPTION OF THE PREFERRED EMBODIMENTS

Reference will now be made in detail to the illustrated embodiments of the present invention, examples of which are illustrated in the accompanying drawings.

Figure 1:
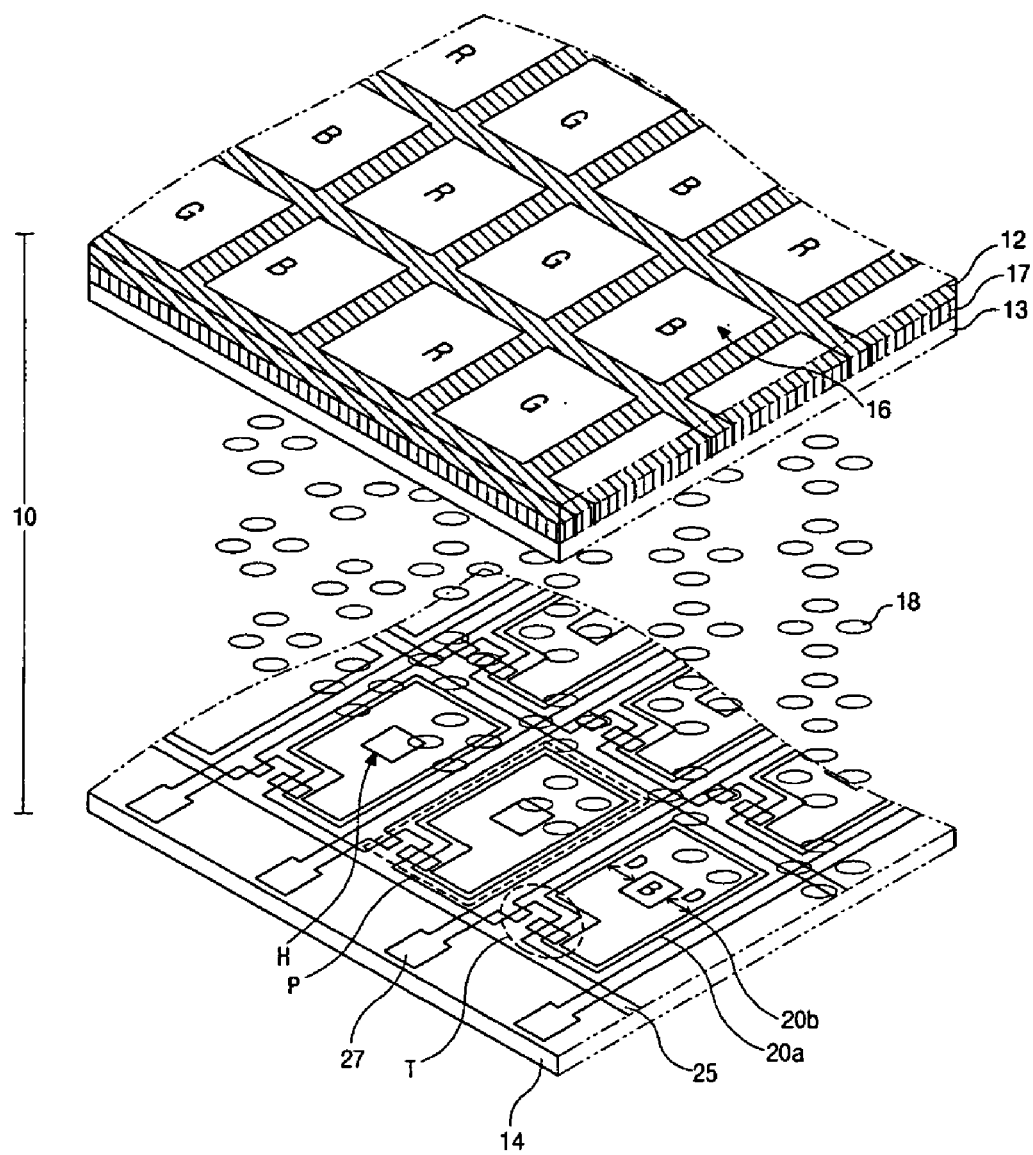
FIG. 1 is an exploded perspective view of an LCD device according to the related art.
Figure 2:
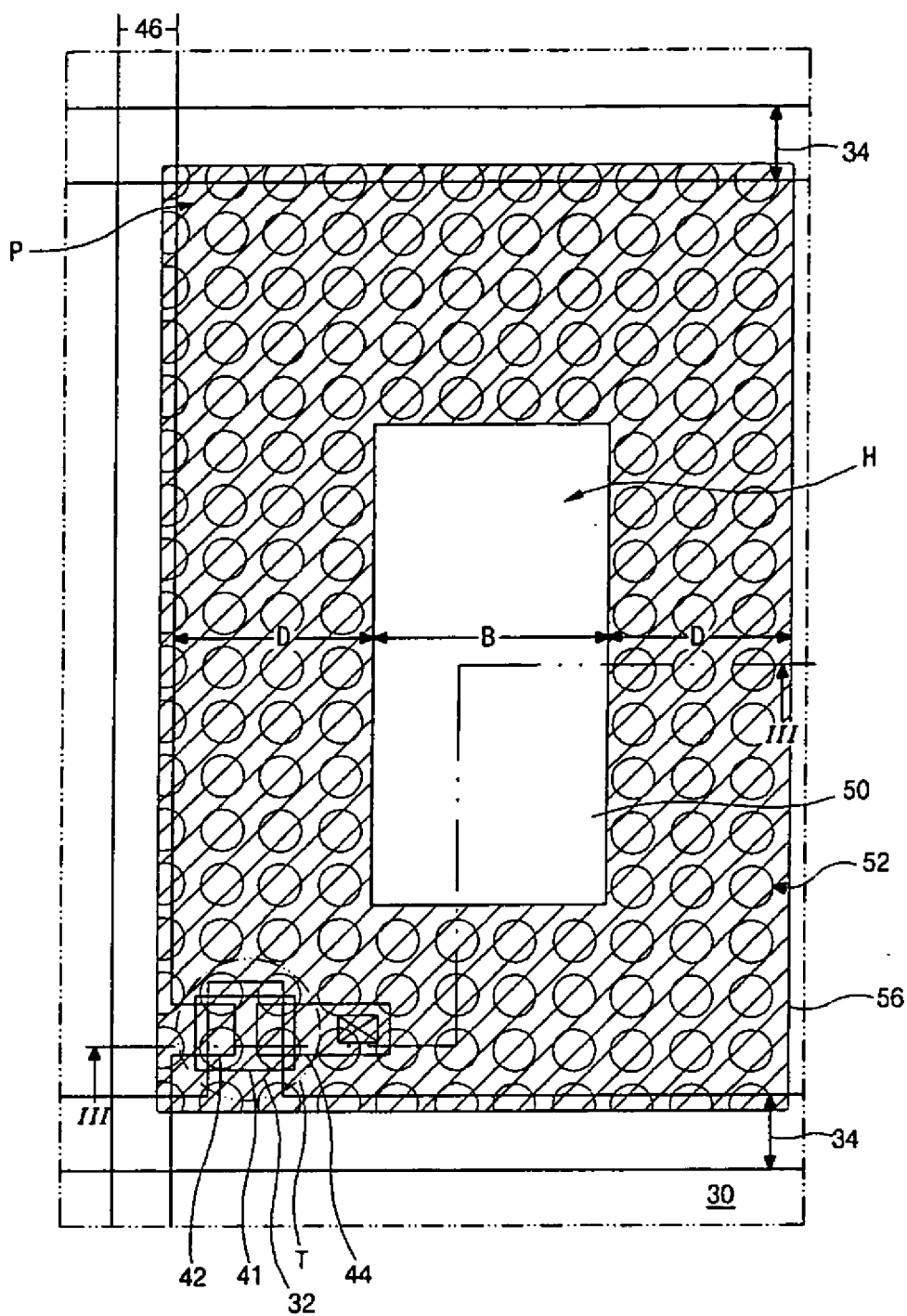
FIG. 2 is a plan view of a pixel region of a transflective LCD device having an uneven reflective layer according to the related art.
Figure 3A:
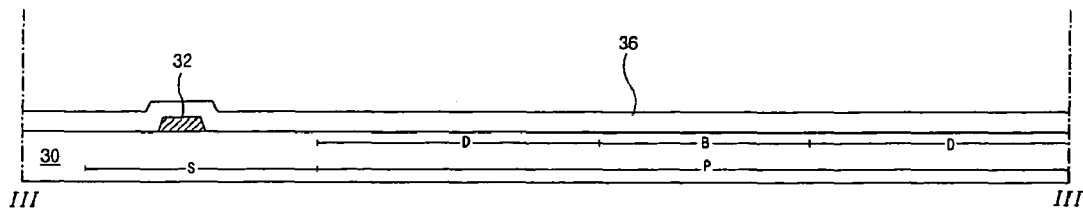
FIG. 3A is a cross-sectional view taken along line III-III of FIG. 2, showing a first mask process for fabricating a transflective LCD device according to the related art.
Figure 3B:
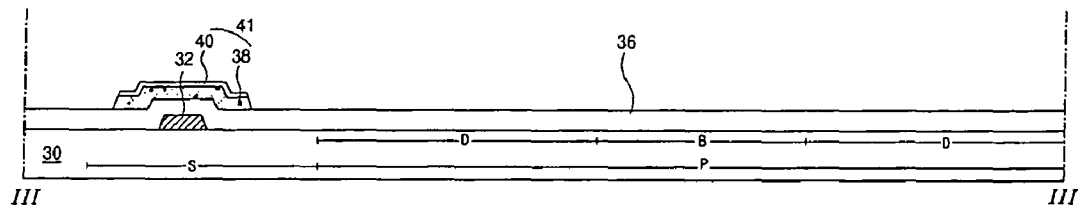
FIG. 3B is a cross-sectional view taken along line III-III of FIG. 2, showing a second mask process for fabricating a transflective LCD device according to the related art.
Figure 3C:
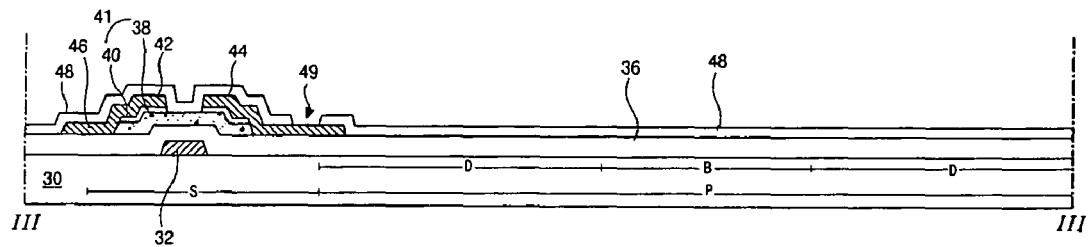
FIG. 3C is a cross-sectional view taken along line III-III of FIG. 2, showing third and fourth mask processes for fabricating a transflective LCD device according to the related art.
Figure 3D:
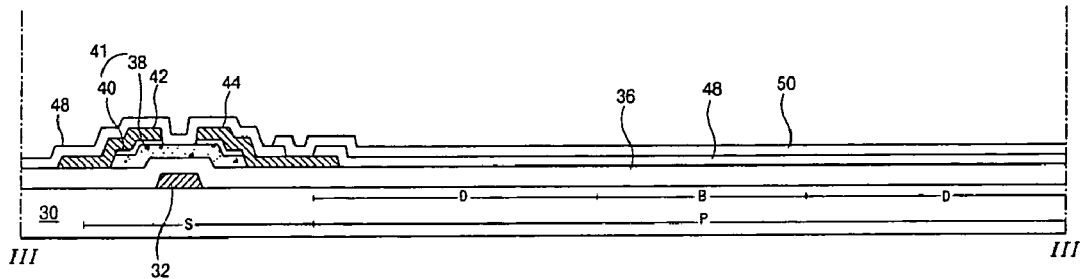
FIG. 3D is a cross-sectional view taken along line III-III of FIG. 2, showing a fifth mask process for fabricating a transflective LCD device according to the related art.
Figure 3E:
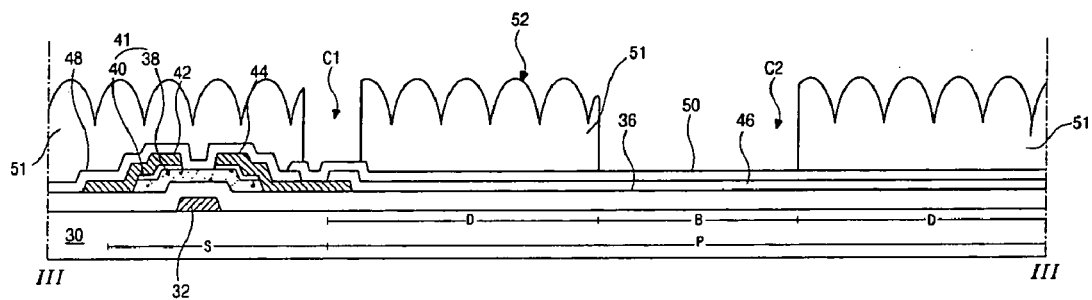
FIG. 3E is a cross-sectional view taken along line III-III of FIG. 2, showing a sixth mask process for fabricating a transflective LCD device according to the related art.
Figure 3F:
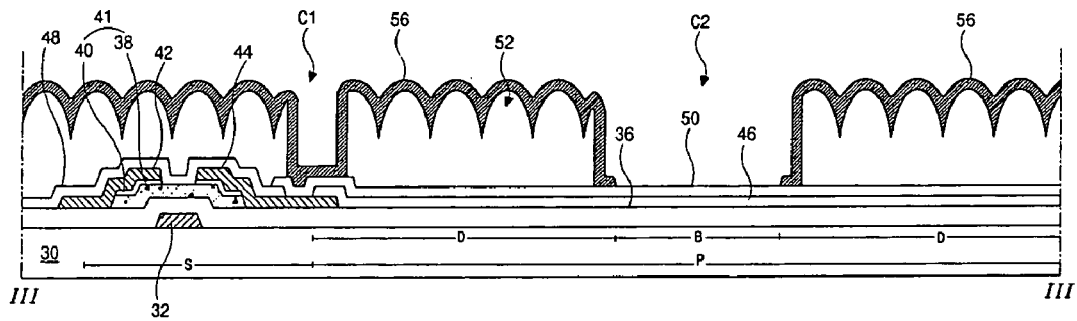
FIG. 3F is a cross-sectional view taken along line III-III of FIG. 2, showing a seven mask process for fabricating a transflective LCD device according to the related art.
Figure 4:
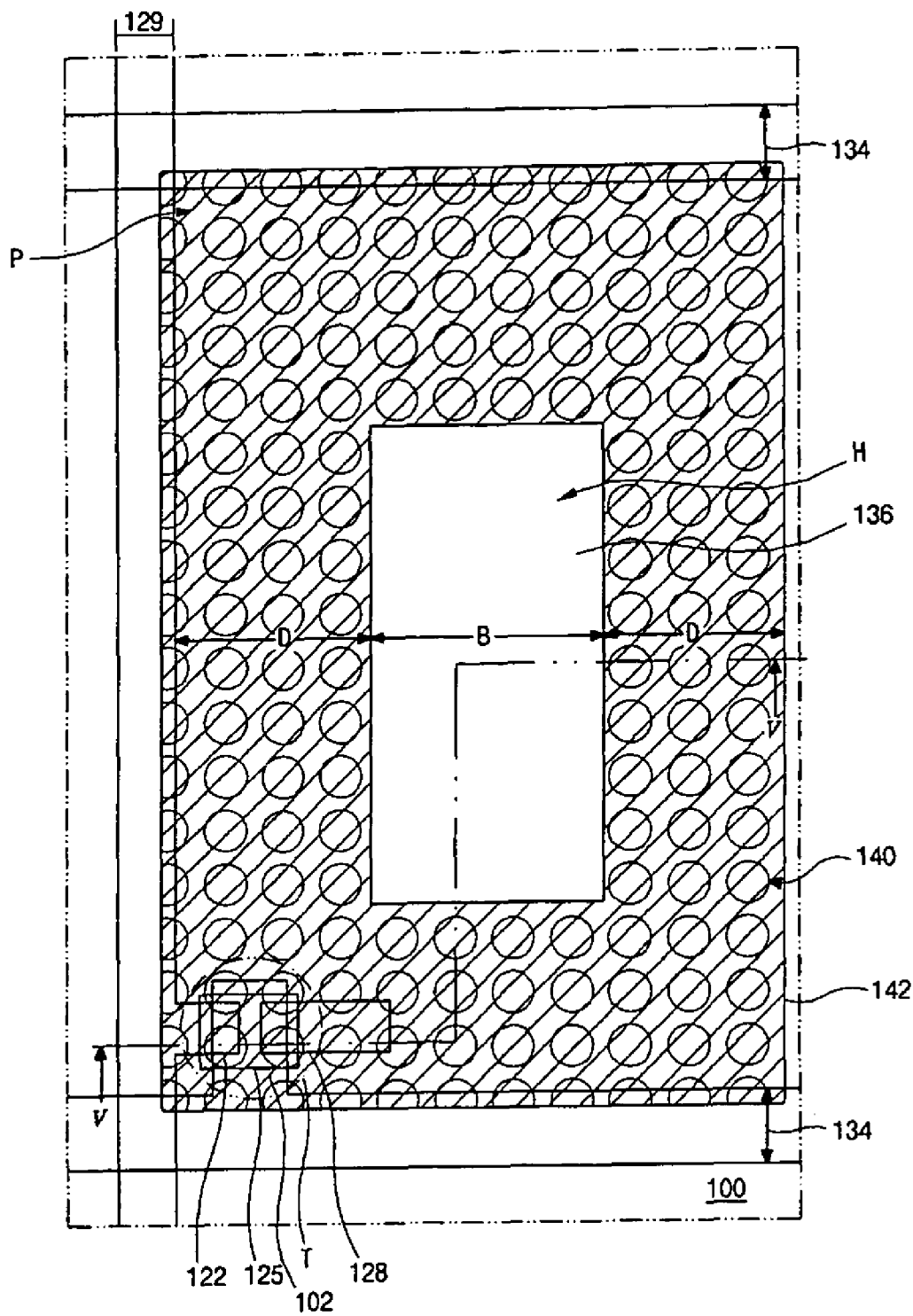
FIG. 4 is a plan view of an exemplary pixel region of a transflective LCD device having an uneven reflective layer according to an embodiment of the present invention.

FIG. 4 is a plan view of an exemplary pixel region of a transflective LCD device having an uneven reflective layer according to an embodiment of the present invention. Referring to FIG. 4, a plurality of gate lines 134 is formed on a substrate 100 along a first direction. At least one data line 129 crosses the plurality of gate lines 134 to define a pixel region P.

A thin film transistor T is formed near a crossing of one of the plurality of gate lines 134 and the at least one data line 129. The thin film transistor T includes a gate electrode 102, a semiconductor layer 125, source electrode 122 and drain electrode 128. Although not shown, a first insulating layer covers a portion of the thin film transistor T. The pixel region P and a portion of the drain electrode 128 are exposed through the first insulating layer.

A transparent electrode 136 is located in the pixel region P. The transparent electrode 136 directly contacts the drain electrode 128. A reflective electrode 142 is formed in the pixel region P. The reflective electrode 142 has a transmissive hole H that exposes a central portion of the transparent electrode 136. A reflective portion D of the pixel region P corresponds to a portion unexposed by the transmissive hole H. A transmissive portion B of the pixel region is defined by the portion corresponding to the transparent electrode 136 excluding the reflective portion D.

Figure 5A:
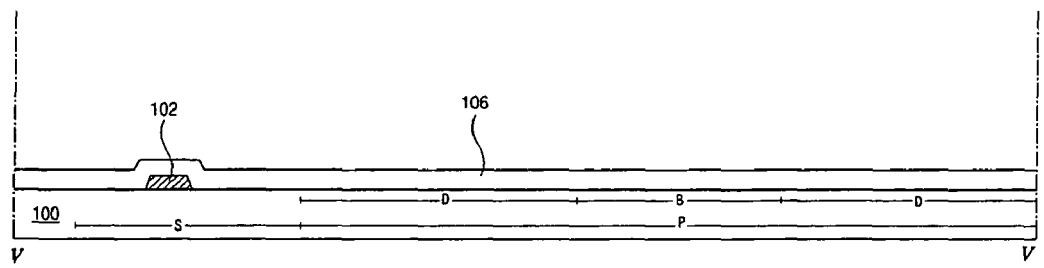
FIG. 5A is a cross-sectional view taken along line V-V of FIG. 4, showing an exemplary first mask process for patterning a first metal layer for a transflective LCD device according to the embodiment of the present invention depicted in FIG. 4.

FIG. 5A is a cross-sectional view taken along line V-V of FIG. 4, showing an exemplary first mask process for patterning a first metal layer for a transflective LCD device according to the embodiment of the present invention depicted in FIG. 4. Referring to FIG. 5A, a pixel region P and a switching region S are defined on the substrate 100. The pixel region P is a unit region for displaying an image. A switching device is located in the switching region S on the substrate 100. The pixel region P includes a transmissive portion B and a reflective portion D.

A metallic material having a low resistance is deposited on the substrate 100 including the pixel region P and the switching region S. The deposited metallic material is patterned into a plurality of gate lines 134 (shown in FIG. 4) and a gate electrode 102 using a first mask process. The gate electrode 102 is connected to the plurality of gate lines 134.

The first mask process is a photolithography process. Although not shown, the first mask process includes coating a photoresist on the metallic material layer, exposing the photoresist using a photo mask, and developing the photoresist to form a photoresist pattern (not shown) by shielding the metallic material. The first mask process further includes etching the metallic material using the photoresist pattern as a shield to pattern the plurality of gate lines 134 and the gate electrode 102. Other mask processes can be performed using steps similar to those used in the first mask process.

The metallic material having low resistance may be one of a single metallic material, such as aluminum (Al), Al alloy, tungsten (W) and chromium (Cr), and a double metallic material, such as Al/Cr and Al/molybdenum (Mo). In an embodiment of the present invention using a double metallic material, the Al material is closer to the substrate 100 than the other metallic material. Intrinsic Al has chemically weak corrosion resistance and hillocks are formed on the top surface of the intrinsic Al when high temperature processes are later performed.

A gate insulating layer 106 is subsequently formed over the entire surface of the substrate 100, including the plurality of gate lines 134 and the gate electrode 102, by depositing an inorganic insulating material or by coating an organic insulating material. The inorganic insulating material may be one of silicon nitride (SiNx) and silicon oxide (SiOx). The organic insulating material may be one of benzocyclobutene (BCB) and acrylic resin.

Figure 5B:
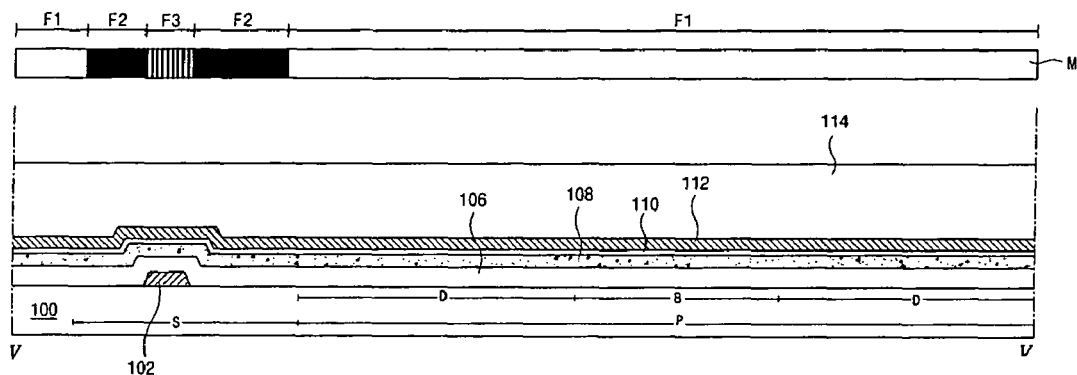
FIG. 5B is a cross-sectional view taken along line V-V of FIG. 4, showing the exposure of a first photoresist layer of the transflective LCD device through a second mask process according to the embodiment of the present invention depicted in FIG. 4.

FIG. 5B is a cross-sectional view taken along line V-V of FIG. 4, showing the exposure of a first photoresist layer of the transflective LCD device through a second mask process according to the embodiment of the present invention depicted in FIG. 4. Referring to FIG. 5B, first and second semiconductor layers 108 and 110 are sequentially formed by depositing intrinsic amorphous silicon and impurity-doped amorphous silicon on the gate insulating layer 106, respectively. Thus, the first semiconductor layer 108 includes the intrinsic amorphous silicon. The second semiconductor layer 110 includes the impurity-doped amorphous silicon.

A metal layer 112 is formed by depositing a conductive metallic material on the substrate 110 including the semiconductor layers 108 and 110 in a manner similar to FIG. 5A. Next, a photoresist layer 114 is formed by coating a photosensitive material, such as a photoresist, over the entire surface of the substrate 100 including the metal layer 112. Then, a mask M is disposed over the substrate 100 including the photoresist layer 114.

The mask M includes a transmissive region F1, a shielding region F2 and a half-transmissive region F3. The half-transmissive region F3 of the mask M lowers light intensity or reduces light transmission. The half-transmissive region F3 includes a plurality of slits or a half-transmissive layer.

Portions of the photoresist layer 114 are then exposed by irradiating light through the mask M. A first portion of the photoresist layer 114 corresponding to the transmissive region F1 of the mask M is fully exposed to the irradiated light. A second portion of the photoresist layer 114 corresponding to the shielding region F2 of the mask M is shielded from the irradiated light. A third portion of the photoresist layer 114 corresponding to the half-transmissive region F3 of the mask M is only partially exposed to the light.

Figure 5C:
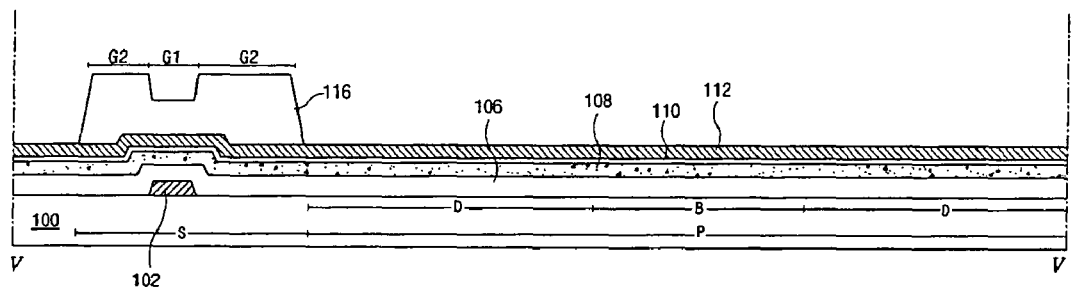
FIG. 5C is a cross-sectional view taken along line V-V of FIG. 4, showing the formation of a photoresist pattern of the transflective LCD device through the second mask process according to the embodiment of the present invention depicted in FIG. 4.

FIG. 5C is a cross-sectional view taken along line V-V of FIG. 4, showing the formation of a photoresist pattern of the transflective LCD device through the second mask process according to the embodiment of the present invention depicted in FIG. 4. Referring to FIG. 5C, the fully exposed portion of the photoresist layer 114 (shown in FIG. 5B) is developed to form a first photoresist pattern 116. The first photoresist pattern 116 covers the switching region S. A portion of the metal layer 112 is exposed by the removal of the fully exposed portion of the photoresist layer. The exposed portion of the metal layer 112 corresponds to the pixel region P and excludes the first photoresist pattern 116.

The first photoresist pattern 116 includes a first portion G1 and a second portion G2. The first portion G1 corresponds to the portion of the photoresist layer 114 (shown in FIG. 5B) that was partially exposed by the half-transmissive region F3 of the mask M (shown in FIG. 5B). The second portion G2 corresponds to the portion of the photoresist layer 114 (shown in FIG. 5B) that was shielded by the shielding region F2 of the mask M (shown in FIG. 5B). The first portion G1 of the first photoresist pattern 116 is partially removed during the developing process. Thus, the first photoresist pattern 116 in the first portion G1 is thinner than in the second portion G2.

Figure 5D:
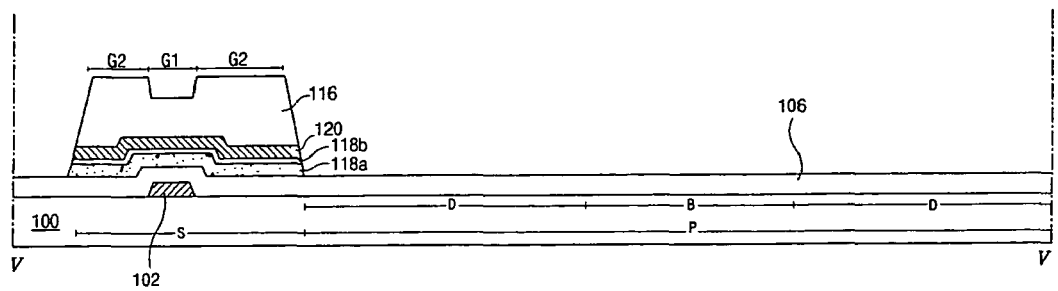
FIG. 5D is a cross-sectional view taken along line V-V of FIG. 4, showing the formation of a second metal pattern and semiconductor patterns of the transflective LCD device through the second mask process according to the embodiment of the present invention depicted in FIG. 4.

FIG. 5D is a cross-sectional view taken along line V-V of FIG. 4, showing the formation of a second metal pattern and semiconductor patterns of the transflective LCD device through the second mask process according to the embodiment of the present invention depicted in FIG. 4. Referring to FIG. 5D, the exposed portion of the metal layer 112 is removed. Thereby, a metal pattern 120 is formed underneath the first photoresist pattern 116. Portions of the first and second semiconductor layers 108 and 110 corresponding to and underneath the exposed portion of the metal layer 112 are subsequently removed. Thereby, first and second semiconductor patterns 118a and 118b are formed underneath the metal pattern 120 and the first photoresist pattern 116. Thus, the first semiconductor pattern 118a, the second semiconductor pattern 118b and the metal pattern 120 are disposed in successive order upward on the substrate 100.

Figure 5E:
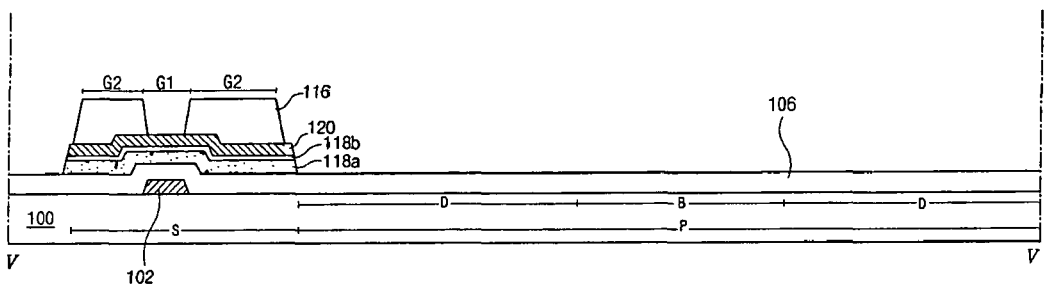
FIG. 5E is a cross-sectional view taken along line V-V of FIG. 4, showing an exposure of the second metal pattern and the semiconductor patterns for the transflective LCD device through the second mask process according to the embodiment of the present invention depicted in FIG. 4.

FIG. 5E is a cross-sectional view taken along line V-V of FIG. 4, showing an exposure of the second metal pattern and the semiconductor patterns for the transflective LCD device through the second mask process according to the embodiment of the present invention depicted in FIG. 4. Referring to FIG. 5E, the first portion G1 of the first photoresist pattern 116 is removed by an ashing process. Thereby, a portion of the metal pattern 120 corresponding to the first portion G1 is exposed. The exposed portion of the metal pattern 120 is removed by using the first photoresist pattern 116 as a shield. Then, a portion of the second semiconductor pattern 118b corresponding to the exposed metal pattern 120 is removed, thereby forming a channel region. After removing the exposed portions of the metal pattern 120 and the second semiconductor pattern 118b, the first photoresist pattern 116 is stripped using a stripping agent (not shown).

Figure 5F:
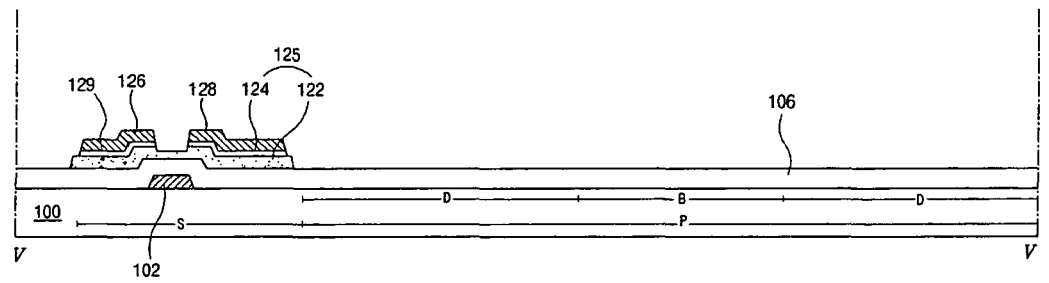
FIG. 5F is a cross-sectional view taken along line V-V of FIG. 4, showing the formation of an active layer and an ohmic contact layer for the transflective LCD device through the second mask process according to the embodiment of the present invention depicted in FIG. 4.

FIG. 5F is a cross-sectional view taken along line V-V of FIG. 4, showing the formation of an active layer and an ohmic contact layer for the transflective LCD device through the second mask process according to the embodiment of the present invention depicted in FIG. 4. Referring to FIG. 5F, after the stripping process, the first and second semiconductor patterns 118a and 118b (shown in FIG. 5E) are patterned into an active layer 122 and an ohmic contact layer 124, respectively. In addition, the pre-patterned metal pattern 120 (shown in FIG. 5E) is patterned into a source electrode 126 and a drain electrode 128 spaced apart from each other. The active layer 122 and the ohmic contact layer 124 form a semiconductor layer 125.

According to an embodiment of the present invention, the active layer 122, the ohmic contact layer 124, the source electrode 126, the drain electrode 128, and a data line 129 are formed in the same process, which is the second mask process described above in reference to FIGS. 5B to 5F. The data line 129 is formed using the same material as the source and drain electrodes 126 and 128 and is connected to the source electrode 126. The data line 129 covers a corresponding portion of the first and second semiconductor patterns 118a and 118b (shown in FIG. 5E).

Figure 5G:
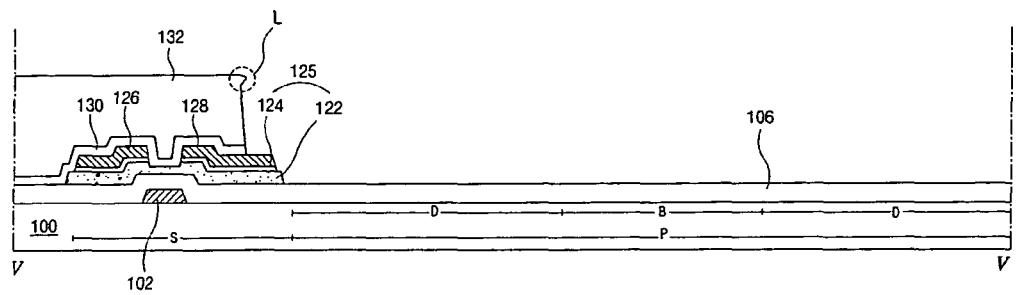
FIG. 5G is a cross-sectional view taken along line V-V of FIG. 4, showing an exemplary third mask process for forming a second photoresist layer of the transflective LCD device according to the embodiment of the present invention depicted in FIG. 4.

FIG. 5G is a cross-sectional view taken along line V-V of FIG. 4, showing an exemplary third mask process for forming a second photoresist layer of the transflective LCD device according to the embodiment of the present invention depicted in FIG. 4. Referring to FIG. 5G, a passivation layer 130 is formed by depositing or coating an insulating material over the entire surface of the substrate 100 including the source and drain electrodes 126 and 128. The passivation layer 130 may include an inorganic insulating material, for example one of silicon nitride (SiNx) and silicon oxide (SiOx).

A second photoresist pattern 132 is subsequently formed to cover a portion of the passivation layer 130 including a portion of the thin film transistor T. A remaining portion of the passivation layer 130, which overlaps the pixel region P and a portion of the drain electrode 128, is not covered by the second photoresist pattern 132. The exposed portion of the passivation layer 130 is removed, thereby exposing the overlapped portion of the drain electrode 128 and a portion of the gate insulating layer 106 within the pixel region P. Moreover, the second photoresist pattern 132 includes a shoulder portion L overlooking the exposed portion of the drain electrode 128.

Figure 5H:
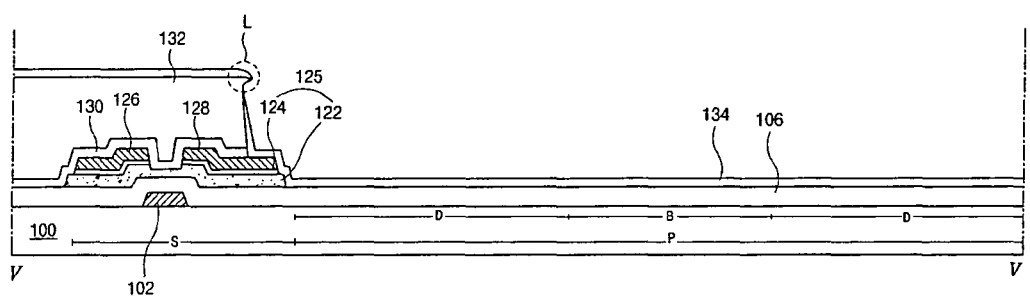
FIG. 5H is a cross-sectional view taken along line V-V of FIG. 4, showing the formation of a transparent metal layer of the transflective LCD device through the third mask process according to the embodiment of the present invention depicted in FIG. 4.

FIG. 5H is a cross-sectional view taken along line V-V of FIG. 4, showing the formation of a transparent metal layer of the transflective LCD device through the third mask process according to the embodiment of the present invention depicted in FIG. 4. Referring to FIG. 5H, a transparent metal layer 134 is formed by depositing a transparent conductive material, such as indium tin oxide (ITO), indium zinc oxide (IZO) or indium tin zinc oxide (ITZO), over the entire surface of the substrate 100, including the patterned passivation layer 130 and the exposed portion of the gate insulating layer 106. The transparent metal layer 134 is not uniformly deposited at the sides of the second photoresist pattern 132, particularly, at the shoulder portion L. Thus, the portion of the transparent metal layer 134 in the shoulder portion L may be separated such that the second photoresist pattern 132 is exposed.

The substrate 100 having the transparent metal layer 134 is dipped in a stripping agent solution to remove the second photoresist pattern 132. The portion of the transparent metal layer 134 on the second photoresist pattern 132 is easily removed because the stripper has access to the second photoresist pattern 132 at the shoulder portion L. Thus, the portions of the transparent metal layer 134 deposited on the top and sides of the second photoresist pattern 132 are removed concurrently with the second photoresist pattern 132.

Figure 5I:
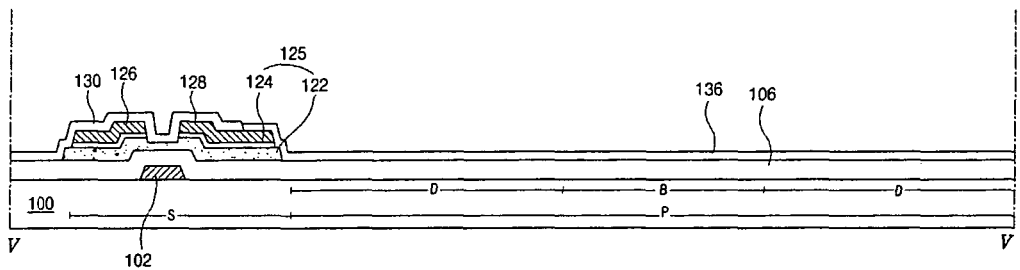
FIG. 5I is a cross-sectional view taken along line V-V of FIG. 4, showing the formation of a transparent electrode of the transflective LCD device through the third mask process according to the embodiment of the present invention depicted in FIG. 4.

FIG. 5I is a cross-sectional view taken along line V-V of FIG. 4, showing the formation of a transparent electrode of the transflective LCD device through the third mask process according to the embodiment of the present invention depicted in FIG. 4. Referring to FIG. 5I, the remaining portion of the transparent metal layer 134 (shown in FIG. 5H) acts as a transparent electrode 136 in the pixel region P. The transparent electrode 136 directly contacts the drain electrode 128, the ohmic contact layer 124 and the active layer 122. Thus, the passivation layer 130 and the transparent electrode 136 can be patterned through the third mask process described in reference to FIGS. 5G to 5I without an additional mask process.

Figure 5J:
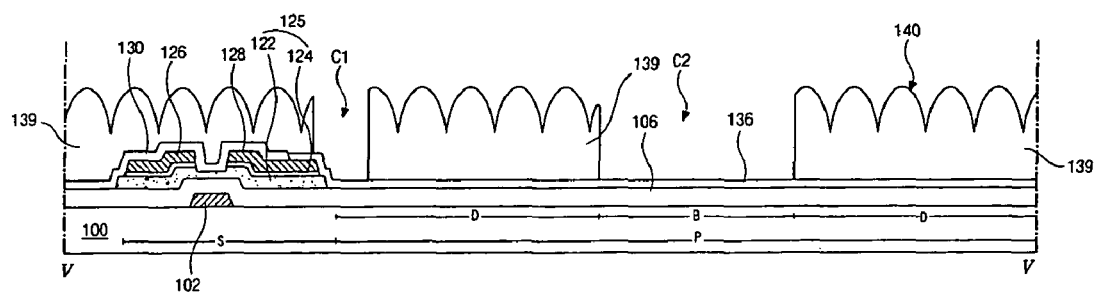
FIG. 5J is a cross-sectional view taken along line V-V of FIG. 4, showing an exemplary fourth mask process for forming holes and uneven patterns on an organic insulating layer of the transflective LCD device according to the embodiment of the present invention depicted in FIG. 4.

FIG. 5J is a cross-sectional view taken along line V-V of FIG. 4, showing an exemplary fourth mask process for forming holes and uneven patterns on an organic insulating layer of the transflective LCD device according to the embodiment of the present invention depicted in FIG. 4. Referring to FIG. 5J, an organic insulating layer 139 is formed by coating an organic insulating material having a good step-coverage property over the entire substrate 100 including the transparent electrode 136. The organic insulating material may include a photosensitive acrylic resin.

Through the fourth mask process, a contact hole C1, a transmissive hole C2 and a first uneven surface 140 are formed. The contact hole C1 exposes a portion of the transparent electrode 136 near the switching region S. The transmissive hole C2 exposes a central portion of the transparent electrode 136 in the pixel region P. The first uneven surface 140 extends over a part of the surface of the organic insulating layer 139 within the reflective portion D including the switching region S.

The central portion of the transparent electrode 136 corresponding to the transmissive hole C2 through the organic insulating layer 139 defines a transmissive portion B. The portion of the organic insulating layer 139 covered by the first uneven surface 140 and including the switching region S defines a reflective portion D. The portion of the transparent electrode 136 exposed through the contact hole C1 may correspond to the contact portion of the transparent electrode 136 and the drain electrode 128 as shown in FIG. 5J. The first uneven surface 140 may be formed in an hemispherical shape by melting the patterned organic insulating layer 139 at about 350° after initially forming a plurality of saw-tooth shapes as viewed in a cross-sectional view.

Figure 5K:
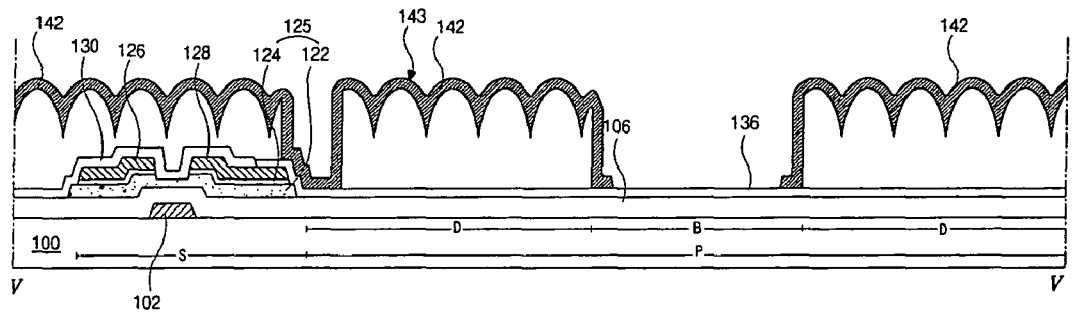
FIG. 5K is a cross-sectional view taken along line V-V of FIG. 4, showing an exemplary fifth mask process for forming a reflective electrode on an organic insulating layer of the transflective LCD device according to the embodiment of the present invention depicted in FIG. 4.

FIG. 5K is a cross-sectional view taken along line V-V of FIG. 4, showing an exemplary fifth mask process for forming a reflective electrode on an organic insulating layer of the transflective LCD device according to the embodiment of the present invention depicted in FIG. 4. Referring to FIG. 5K, a reflective electrode 142 is formed by depositing and patterning a metallic material having a good reflectivity over the substrate 100 including the first uneven surface 140. The reflective electrode 142 is located in the reflective portion D. The metallic material used for the reflective 142 may include one of aluminum (Al) and silver (Ag).

According to an embodiment of the present invention, as shown in FIG. 5K, the reflective electrode 142 is connected to the transparent electrode 136 through the contact hole C1. The reflective electrode 142 includes a second uneven surface 143 corresponding to the first uneven surface 140. According to another embodiment of the present invention, the uneven reflective layer may be electrically isolated from the transparent electrode.

A transflective LCD device according to embodiments of the present invention has the following advantages. The array substrate of the transflective LCD device may be formed using five mask processes or photolithography processes. Processing time and production costs can be reduced because of the omission of two mask processes in comparison with the related art. The uneven reflective electrode increases reflection efficiency, thus providing high brightness. The reduction in mask processes lowers defect probability, thereby improving the production yield and providing competitive advantage in production.

It will be apparent to those skilled in the art that various modifications and variations can be made in the transflective liquid crystal display device and fabricating method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating a substrate for a transflective liquid crystal display device, comprising:
    forming a plurality of gate lines on a substrate;
    forming at least one data line, a thin film transistor including a semiconductor layer of silicon, a source electrode and a drain electrode, the at least one data line crossing the plurality of gate lines to define a pixel region including a transmissive portion and a reflective portion, the source and drain electrodes directly contacting an upper surface of the semiconductor layer, the source electrode being connected to the at least one data line, and the drain electrode being spaced apart from the source electrode;

forming a first insulating layer directly covering a portion of the thin film transistor, the first insulating layer uncovering the pixel region and a portion of the drain electrode;

forming a transparent material layer over the entire surface of the substrate including a first photoresist pattern and the first insulating layer, wherein the first photoresist pattern contacts all top surfaces of the first insulating layer;

simultaneously removing the first photoresist pattern and a portion of the transparent material layer formed on the first photoresist pattern by lifting off the first photoresist pattern to form a transparent electrode in the pixel region, the transparent electrode directly contacting the drain electrode and the semiconductor layer and covering an entire surface of the transmissive and reflective portions;

forming a second insulating layer on the transparent electrode, the second insulating layer having a first uneven surface; and forming a reflective layer in the reflective portion, the reflective layer having a second uneven surface corresponding to the first uneven surface, wherein the reflective layer overlaps the transparent electrode in the reflective portion with the second insulating layer therebetween.

2. The method according to claim 1, wherein forming the at least one data line, the source electrode and the drain electrode includes forming a semiconductor layer, the semiconductor layer being formed below the at least one data line, the source electrode and the drain electrode, a pattern of the semiconductor layer corresponding to a pattern of the at least one data line, the source electrode and the drain electrode.

3. The method according to claim 1, wherein forming the at least one data line, the source electrode and the drain electrode includes:

forming a gate insulating layer on an entire surface of the substrate including the plurality of gate lines;

sequentially forming an intrinsic amorphous silicon layer on the gate insulating layer, an impurity-doped amorphous silicon layer on the intrinsic amorphous silicon layer, and a metal layer on the impurity-doped amorphous silicon layer;

forming a second photoresist pattern including a first portion and a second portion, the first portion of the second photoresist pattern being thinner than the second portion of the second photoresist pattern, etching the metal layer, the impurity-doped amorphous silicon layer and the intrinsic amorphous silicon layer using the second photoresist pattern as a shield; and removing the first portion of the second photoresist pattern, and removing a corresponding portion of the metal layer and a corresponding portion of the impurity-doped amorphous silicon layer to define a channel region corresponding to the exposed portion of the intrinsic amorphous silicon layer.

4. The method according to claim 1, wherein forming the first insulating layer includes:

forming a first insulating material layer over the entire surface of the substrate including the thin film transistor;

forming a second photoresist pattern to cover a portion of the first insulating material layer including a portion of the thin film transistor, a remaining portion of the first insulating layer overlapping the pixel region and a portion of the drain electrode; and removing the remaining portion of the first insulating material layer uncovered by the second photoresist pattern to expose the portion of the drain electrode and a portion of the gate insulating layer within the pixel region.

5. The method according to claim 1, wherein the second insulating layer includes a first hole that exposes a portion of the transparent electrode corresponding to the exposed portion of the drain electrode.

6. The method according to claim 5, wherein the reflective layer is connected to the transparent electrode through the first hole.

7. The method according to claim 1, wherein the step of forming the second insulating layer includes:

forming an insulating material layer on the transparent electrode;

forming a plurality of saw-tooth shapes on the insulating material layer; and melting the insulating material layer including the plurality of saw-tooth shapes at about 35° C.° to form the first uneven shape.

* * * * *